(12) United States Patent
Cheong et al.

(10) Patent No.: US 7,297,722 B2
(45) Date of Patent: Nov. 20, 2007

(54) RADIALLY MULTI-BRANCHED POLYMER AND POROUS FILM USING THE SAME

(75) Inventors: Jae Ho Cheong, Daejeon (KR); Gwi Gwon Kang, Seoul (KR); Min Jin Ko, Daejeon (KR); Jung Won Kang, Seoul (KR); Myung Sun Moon, Daejeon (KR); Byung Ro Kim, Daejeon (KR); Bum Gyu Choi, Daejeon (KR); Dae Ho Kang, Daejeon (KR); Jeong Man Son, Gyeongsangbuk-do (KR)

(73) Assignee: LG Chem, Ltd., Seoul (KR)

( * ) Notice: Subject to any disclaimer, the term of this patent is extended or adjusted under 35 U.S.C. 154(b) by 292 days.

(21) Appl. No.: 10/960,040

(22) Filed: Oct. 8, 2004

(65) Prior Publication Data

US 2005/0182202 A1 Aug. 18, 2005

(30) Foreign Application Priority Data

Oct. 9, 2003 (KR) .................. 10-2003-0070376

(51) Int. Cl.
*C08G 61/12* (2006.01)
*C08G 63/91* (2006.01)
*C08J 9/00* (2006.01)

(52) U.S. Cl. .................... 521/64; 521/87; 525/398; 525/472; 528/230; 528/247; 528/265

(58) Field of Classification Search ............... 525/472, 525/398; 528/265, 230, 247; 521/61, 87
See application file for complete search history.

(56) References Cited

U.S. PATENT DOCUMENTS 5,886,110 A    3/1999   Gozzini et al.

FOREIGN PATENT DOCUMENTS

| GB | 2151637 A | 7/1985 |
|---|---|---|
| JP | 7-242722 A | 9/1995 |
| KR | 10-2002-0080196 A | 10/2002 |
| WO | WO-95/06081 | 3/1995 |
| WO | WO-99/21935 | 5/1999 |

OTHER PUBLICATIONS

Nrita et al., "Living Polymerization of methyl methacrylate by novel samarium based trifunctional initiator", Polymer Bulletin, 45, 231-36, 2000.*

* cited by examiner

*Primary Examiner*—Irina S Zemel
(74) *Attorney, Agent, or Firm*—Birch, Stewart, Kolasch & Birch, LLP (57) ABSTRACT

Described is a radially multi-branched polymer represented by the following formula (I): $ABi$ (I), which includes a central molecule (A) to which side-branches (B) are bonded in at least three positions ($i \geq 3$). Also described are methods for preparing a multi-branched polymer as well as a porous insulating film including a multi-branched polymer.

11 Claims, 1 Drawing Sheet

RADIALLY MULTI-BRANCHED POLYMER AND POROUS FILM USING THE SAME

TECHNICAL FIELD

The present invention relates to a novel radially multi-branched polymer and particularly to a radially multi-branched polymer that includes a central molecule (A) to which side-branches (B) are bonded in at least three positions and has an average molecular weight of between 500 and 100,000. More particularly, the present invention relates to a radially multi-branched porogen represented by the following formula (I) and having a polyalkylene oxide, a polyacrylate, a polyester, a polyamide or derivatives thereof as a side-branch:

$$AB_i \quad (I)$$

wherein the central molecule (A) is selected from the group consisting of:

wherein X is H or $CH_3$;
the side-branch (B) is —R or wherein R is selected from the group consisting of the following $R_1$ to $R_4$;

$R_1$ is selected from the group consisting of: $(OCH_2CH_2)_nOZ$, $(OCH_2CHCH_3)_nOZ$, $(OCHCH_3CH_2)_nOZ$, $(OCH_2CH_2)_n(OCH_2CHCH_3)_m(OCH_2CH_2)_kOZ$, $(OCH_2CH_2)_n(OCHCH_3CH_2)_m(OCH_2CH_2)_kOZ$, $(OCH_2CHCH_3)_n(OCH_2CH_2)_m(OCH_2CHCH_3)_kOZ$, $(OCHCH_3CH_2)_n(OCH_2CH_2)_m(OCHCH_3CH_2)_kOZ$, $(OCH_2CHCH_3)_n(OCH_2CH_2)_m(OCHCH_3CH_2)_kOZ$, and $(OCHCH_3CH_2)_n(OCH_2CH_2)_m(OCH_2CHCH_3)_kOZ$;

$R_2$ is $OCOC(CH_3)_2(CH_2CQ(CO_2Z))_nW$;
$R_3$ is $(O(CH_2)_nCO)_mOZ$;
$R_4$ is $(NH(CH_2)_nCO)_mNZ_2$;

wherein each of n, m and k represents an integer between 0 and 200;
Q is selected from the group consisting of H, $CH_3$, $CH_2CH_3$, $CH_2CH_2OH$ and $CH_2CH_2NH_2$;
W is selected from Br, I and H;
Z is selected from the group consisting of H, methyl, ethyl, propyl, isopropyl, butyl, isobutyl, tert-butyl, pentyl, isopentyl, neopentyl, cyclopentyl, hexyl, cyclohexyl, vinyl (—CH=$CH_2$), —CCH, propargyl, allyl, benzyl, acetyl ($COCH_3$), propionyl, isobutyryl, neopetyryl, $CH_2CH_2CH_2Si(OMe)_3$, $CH_2CH_2CH_2Si(OEt)_3$, $CH_2CH_2CH_2SiMe(OMe)_2$, $CH_2CH_2CH_2SiMe(OEt)_2$, $CH_2CH_2CH_2Si(OMe)Me_2$, $CH_2CH_2CH_2Si(OEt)Me_2$, $CH_2CH_2OH$ and $CH_2CH_2NH_2$;
Y is a linking group between a central molecule and a side-branch, wherein Y is selected from the group consisting of O and $OCH_2$; and
i is a natural number of 3 or more.

BACKGROUND ART

Recently, there is an increasing interest in polymeric materials having nano-sized spherical structures, and their applications are extended to electro-, bio- and functional polymers and other additives.

According to a recent tendency of reduction in a metal line pitch resulting from high-density integration of semiconductor devices, several problems including propagation delay, cross talk, power dissipation, etc., may occur. To solve such problems, a method of reducing RC (resistance×capacitance) delay may be considered first of all. Particularly, used is a method of reducing resistance of a metal line material and reducing conductance between metal lines. For the purpose of carrying out such a method, copper (Cu) with good conductivity is generally used as a metal line material. Otherwise, materials with good insulation property are generally used between metal lines. Most insulating materials that are currently used are formed of silicon oxides having a dielectric constant of 4.0. Therefore, it is desirable to reduce the dielectric constant to 2.2, preferably to 2.0, or less.

A method for introducing pores into an insulating film has been researched so as to obtain a thin insulating film having a dielectric constant of 2.2 or less. A material used for such pore generation is referred to as a porogen (or pore generator: pore-generating organic polymer), which generates pores particularly by calcination. Linear polymeric polycaprolactone and polyacrylate, branched polyester having multiple side-branches, etc., have been used as pore generators. However, they are not suitable for such use and thus there is a need to improve them.

In the case of branched polymer or dendrimer used for generating pores, it is difficult to control the molecular weight, molecular weight distribution, microstructure, etc., and thus to generate micropores having a uniform size.

Additionally, although there is an example that crosslinked nanoparticles have been used to form nanopores, it is also found to be difficult to form nanoparticles having a uniform size. Moreover, there is a possibility of pyrolysis residues being present.

BRIEF DESCRIPTION OF THE DRAWINGS

The foregoing and other objects, features and advantages of the present invention will become more apparent from the following detailed description when taken in conjunction with the accompanying drawings in which.

DISCLOSER OF THE INVENTION

Therefore, the present invention has been made in view of the above-mentioned problems. It is an object of the present invention to provide a novel radially multi-branched polymer that is prepared with ease, and has a narrow molecular weight distribution and an easily controllable fine nanostructure. It is another object of the present invention to provide an insulating film obtained by using the above-described radially multi-branched polymer.

Although conventional pore generators have a linear or bar-shaped structure, the present inventors intended to provide a pore generator having a spherical structure if possible, so as to inhibit phase separation, to generate pores having a small size and uniform distribution and to improve the strength and/or dielectric constant of an insulating film.

In order to provide a pore generator having a spherical structure, a pore generator consists of a central molecule and side-branches. A benzyl group is selected as a central molecule, because it shows a high reactivity upon bonding of side-branches and is capable of free rotation, and thus provides a uniform molecular weight distribution and improved productivity and facilitates mass production. Further, side-branches are bonded to the central molecule as symmetrically as possible, a pore generation material having a spherical structure is provided and one example is a radially multi-branched polymer represented by the following formula (I).

According to an aspect of the present invention, there is provided a radially multi-branched polymer having a central molecule (A) to which side-branches (B) are bonded in at least three positions, wherein the radially multi-branched polymer is represented by the following formula (I) and has a polyalkylene oxide, a polyacrylate, a polyester, a polyamide or a derivatives thereof as a side-branch. According to another aspect of the present invention, there is also provided a low dielectric insulating film obtained by using the radially multi-branched polymer as a porogen:

$$AB_i \qquad (I)$$

wherein the central molecule (A) is selected from the group consisting of:

wherein X is H or $CH_3$;
the side-branch (B) is —R or wherein R is selected from the group consisting of the following $R_1$ to $R_4$;

$R_1$ is selected from the group consisting of: $(OCH_2CH_2)_n OZ$, $(OCH_2CHCH_3)_n OZ$, $(OCHCH_3CH_2)_n OZ$, $(OCH_2CH_2)_n(OCH_2CHCH_3)_m(OCH_2CH_2)_k OZ$, $(OCH_2CH_2)_n(OCHCH_3CH_2)_m(OCH_2CH_2)_k OZ$, $(OCH_2CHCH_3)_n(OCH_2CH_2)_m(OCH_2CHCH_3)_k OZ$, $(OCHCH_3CH_2)_n(OCH_2CH_2)_m(OCHCH_3CH_2)_k OZ$, $(OCH_2CHCH_3)_n(OCH_2CH_2)_m(OCHCH_3CH_2)_k OZ$ and $(OCHCH_3CH_2)_n(OCH_2CH_2)_m(OCH_2CHCH_3)_k OZ$;

$R_2$ is $OCOC(CH_3)_2(CH_2CQ(CO_2Z))_n W$;
$R_3$ is $(O(CH_2)_n CO)_m OZ$;
$R_4$ is $(NH(CH_2)_n CO)_m NZ_2$;

wherein each of n, m and k represents an integer between 0 and 200;

Q is selected from the group consisting of H, $CH_3$, $CH_2CH_3$, $CH_2CH_2OH$ and $CH_2CH_2NH_2$;

W is selected from Br, I and H;

Z is selected from the group consisting of H, methyl, ethyl, propyl, isopropyl, butyl, isobutyl, tert-butyl, pentyl, isopentyl, neopentyl, cyclopentyl, hexyl, cyclohexyl, vinyl (—CH=CH$_2$), —CCH, propargyl, allyl, benzyl, acetyl (COCH$_3$), propionyl, isobutyryl, neopetyryl, CH$_2$CH$_2$CH$_2$Si(OMe)$_3$, CH$_2$CH$_2$CH$_2$Si(OEt)$_3$, CH$_2$CH$_2$CH$_2$SiMe(OMe)$_2$, CH$_2$CH$_2$CH$_2$SiMe(OEt)$_2$, CH$_2$CH$_2$CH$_2$Si(OMe)Me$_2$, CH$_2$CH$_2$CH$_2$Si(OEt)Me$_2$, CH$_2$CH$_2$OH and CH$_2$CH$_2$NH$_2$;

Y is a linking group between a central molecule and a side-branch, wherein Y is selected from the group consisting of O and OCH$_2$; and i is a natural number of 3 or more.

When an organopolysiloxane and a porogen are dissolved in an organic solvent to form a solution, it is preferable that both components are mixed well with each other. The most important factor for such mixing is the interaction between both components. Therefore, suitable heteroatoms as described above have to be used in positions of R$_1$, R$_2$, R$_3$, R$_4$, Q, W, Z, etc.

The radially multi-branched polymer according to the present invention has an average molecular weight of 500 to 100,000, preferably 500 to 50,000. When the molecular weight is less than 500, efficient pore generation cannot be accomplished. On the other hand, when the molecular weight is greater than 100,000, compatibility with a matrix resin decreases and micropores having a very small size is hardly formed.

According to simulation works, when the molecular weight is 10,000 or more, stereostructural shape of the radially multi-branched polymer is changed from a sphere into an ellipsoid. Therefore, it is more preferable that the radially multi-branched polymer has a spherical structure and a molecular weight of 500 to 10,000.

Meanwhile, side-branches having a low molecular weight can provide a porogen having a low molecular weight, while side-branches having a high molecular weight can provide a porogen having a high molecular weight. For example, side-branches having a molecular weight of about 340 can provide a hexa-branched porogen having a molecular weight of about 3500. For another example, side-branches having a molecular weight of about 1,000 can provide a porogen having a molecular weight of about 10,000. It is possible to control molecular weight in this manner for a tri-, tetra- and penta-branched porogens, too. Further, pores with various sizes may be formed by varying the molecular weight of a porogen. For example, a hexa-branched porogen represented by formula (I), and having a molecular weight of about 3500 may form pores having a size of about 2 nm.

Additionally, the radially multi-branched polymer has at least three branches, preferably at least four branches and more preferably at least six branches. It is preferable that the radially multi-branched polymer includes symmetrically linked side-branches in order to provide a spherical structure. The more the branches are, the more the structure approaches a sphere. Further, as the number of branches increases, the polymer branches are limited in movement, thereby inhibiting phase separation. Therefore, it is possible to form a microporous insulating film having a small size and uniform distribution. According to calculation of molecular structures, a hexa-branched polymer is shown to have a three-dimensional spherical structure.

The radially multi-branched polymer porogen represented by formula (I) according to the present invention may be prepared by any known synthetic procedures including a nucleophilic substitution reaction represented by the following reaction scheme 1 or 2; a nucleophilic substitution reaction, followed by a benzene ring formation reaction in the presence of a metal catalyst such as Co$_2$CO$_8$ (reaction scheme 3); or an esterification reaction represented by the following reaction scheme 4 or 5.

-continued

X = H or CH₃
L = leaving group
R = R₁, R₃, R₄

Preparation of radially multi-branched polymers through the nucleophilic substitution reaction as depicted in reaction scheme 1 may be exemplified as follows: hexakisbromomethyl benzene (wherein L=Br) is reacted with a polyalkylene oxide monoalkyl-ether (wherein R=H—(OCH₂CH₂)ₙ—OZ) or -ester in the presence of a base to form a radially hexa-branched polymer (V) that belongs to formula (I).

When trisbromomethyl benzene, tetrakisbromomethyl benzene or pentakisbromomethyl benzene is used instead of hexakisbromomethyl benzene, a radially tri-branched (II), tetra-branched (III) or penta-branched (IV) polymer that belongs to formula (I) can be formed, respectively.

[Reaction Scheme 2]

X = H or CH₃
L = leaving group
R = R₁, R₃, R₄

Preparation of radially multi-branched polymers through the nucleophilic substitution reaction as depicted in reaction scheme 2 may be exemplified as follows: hexakishydroxymethyl benzene is reacted with a side-branch of a polyalkylene oxide monoalkyl-ether or -ester having a mesylate, tosylate or halide in the presence of a base to form a radially hexa-branched polymer (V) that belongs to formula (I). Similarly to reaction scheme 1, when trishydroxymethyl benzene, tetrakishydroxymethyl benzene or pentakishydroxymethyl benzene is used instead of hexakishydroxymethyl benzene, a radially tri-branched (II), tetra-branched (III) or penta-branched (IV) polymer that belongs to formula (I) can be formed, respectively.

[Reaction Scheme 3]

R = R₁, R₃, R₄

Preparation of radially multi-branched polymers through the benzene ring formation reaction as depicted in reaction scheme 3 may be exemplified as follows: 2-butyne-1,4-diethers are reacted with a small amount of catalyst such as $Co_2CO_8$ to form a radially multi-branched polymer represented by formula (I).

According to the above reaction schemes 1 to 3, it is possible to prepare a radially multi-branched polyalkylene oxide ($R_1$) porogen, polyester ($R_3$) porogen or polyamide ($R_4$) porogen. Additionally, porogens having a side-branch formed of a di-block or tri-block of the radially multi-branched polyalkylene oxide porogen, polyester porogen or polyamide porogen may be prepared through a synthetic route similar to the above reaction schemes 1 to 3.

A radially multi-branched polyacrylate porogen may be prepared by a nucleophilic substitution reaction (reaction scheme 4) or esterification reaction (reaction scheme 5), followed by the Atom Transfer Radical Polymerization (ATRP) and reduction.

[Reaction Scheme 4]

-continued

X = H or CH$_3$
L = leaving group

R$_2$ = OCOCC(CH$_2$)$_2$
(CH$_4$CQ$_3$Z)$_n$W
W = Br

R$_2$ = OCOCC(CH$_2$)$_2$
(CH$_4$CQ$_3$Z)$_n$W
W = H (V)

Preparation of a radially multi-branched polyacrylate through the nucleophilic substitution reaction, followed by ATRP and reduction, as depicted in reaction scheme 4 may be exemplified as follows: a radially multi-branched polymer represented by formula (I) may be formed by the method comprising the steps of: reacting hexakisbromomethyl benzene with bromoisobutyric acid (wherein W=Br) in the presence of a base to form hexakisbromoisobutylcarbonyloxymethyl benzene; forming a radially hexa-branched polymer by reacting hexakisbromo-isobutylcarbonyloxymethyl benzene with a methacrylate in the presence of a catalyst such as Cu; and optionally substituting terminal bromine atoms with hydrogen atoms by using a silane and a radical initiator.

When trisbromomethyl benzene, tetrakisbromomethyl benzene or pentakisbromomethyl benzene is used instead of hexakisbromomethyl benzene, a radially tri-branched (II), tetra-branched (III) or penta-branched (IV) polymer that belongs to formula (I) can be formed, respectively.

[Reaction Scheme 5]

-continued

X = H or CH$_3$ (V)

R$_2$ = OCOCC(CH$_2$)$_2$
(CH$_4$CQ$_3$Z)$_n$W
W = Br

R$_2$ = OCOCC(CH$_2$)$_2$
(CH$_4$CQ$_3$Z)$_n$W
W = H

In the above reaction scheme 5 for preparing a radially multi-branched polyacrylate, an esterification reaction is performed instead of the nucleophilic substitution reaction utilized in reaction scheme 4. Similarly, when trishydroxymethyl benzene, tetrakis-hydroxymethyl benzene or pentakishydroxymethyl benzene is used instead of hexakishydroxymethyl benzene, a radially tri-branched (II), tetra-branched (III) or penta-branched (IV) polymer that belongs to formula (I) can be formed, respectively.

Additionally, a di-branched polyoxyalkylene oxide side-branch molecule may be prepared as depicted in the following reaction scheme 6 or 7. Particularly, a substitution reaction of a dihalogen acetone compound is carried out and then reduction is performed. Otherwise, a substitution reaction of a dihalogen acetone compound is carried out and then a Wittig reaction, dimethylation reaction and reduction are performed.

[Reaction Scheme 6]

L = leaving group

Preparation of a di-branched polyoxyalkylene oxide side-branch molecule according to reaction scheme 6 may be exemplified as follows: 1,3-dichloroketone (wherein L=Cl) is reacted with a polyalkylene oxide-monoether (wherein R=H—(OCH$_2$CH$_2$)$_n$OZ)) or -monoester in the presence of a base to form a ketone substituted with the polyalkylene oxide-monoether or -monoester. Then, a secondary alcohol can be obtained from the resultant ketone by using aluminum hydride or boron hydride, as depicted in reaction scheme 6.

[Reaction Scheme 7]

Preparation of a di-branched polyoxyalkylene oxide side-branch molecule as depicted in reaction scheme 7 may be exemplified as follows: triphenylphosphino-methoxymethane is transformed into an ylide by the reaction with t-butoxide and the ketone obtained from the above reaction scheme 6 is reacted with the ylide via a Wittig reaction route. Then, dimethylation reaction is carried out by using tribromoboron to form an aldehyde. Finally, the resultant aldehyde is reduced with boron hydride to form a primary alcohol, as depicted in reaction scheme 7.

Similarly, a di-branched polyester side-branch molecule or di-branched polyamide side-branch molecule may be prepared by a synthetic route similar to reaction scheme 6 or 7.

The radially multi-branched polymer according to the present invention may be used as a pore generator for reducing the density of an insulating film.

When a multi-branched organic polymer is used as a pore generator for a semiconductor insulating material, it is preferable that the multi-branched organic molecule contains no additional heteroatoms besides H, C, N and O. It is more preferable that the multi-branched organic molecule is composed of H, C and O because a low amount of residue is present after pyrolysis. Additionally, the multi-branched organic polymer is suitably pyrolized under inert conditions at a temperature between 200° C. and 400° C. The radially multi-branched polymer represented by formula (I) according to the present invention is pyrolized well at the above temperature.

In order to form a porous insulating film, used are a resin capable of forming a matrix and the radially multi-branched polymer according to the present invention, as a pore generator.

There is no particular limitation in the matrix-forming resin, but it is preferable that the resin is thermally stable at the pyrolysis temperature of the radially multi-branched polymer and maintains compatibility during film formation so as to prevent phase separation. Particularly, when it is used for insulating materials of semiconductors, highly heat resistant polymer resins that are thermally stable at a temperature of 400° C. or higher, such as polyimide resins, polyarylene ether resins, polyphenylene resins and derivatives thereof and organopolysiloxane resins are preferably used.

A porogen is suitably used in the weight ratio of [matrix-forming resin:porogen] of 100:2 to 50:50 and preferably 100:2 to 60:40 in order to obtain excellent strength of an insulating film.

To form an insulating film, a spin coating method, a dipping method, a roll coating method, etc., may be used. These methods permit forming of a film with a predetermined thickness. Among these, a spin coating method is particularly preferable for manufacturing an interlayer dielectric film for a multilayer printed circuit board in a semiconductor device.

Generally, a method for manufacturing a porous insulating film by using a radially multi-branched polymer includes the steps of: coating a composition containing a highly heat resistant resin and the radially multi-branched polymer, drying and curing the coated composition, and performing pyrolysis of the radially multi-branched polymer to obtain a porous insulating film.

The resultant porous film is useful for an interlayer insulating film for electronic devices, a surface protective film for electronic devices, an interlayer insulating film for multilayer printed circuit boards, a protective film or insulating protective film for liquid crystal display devices, a low refractive film, a gas barrier film, and a porous film for embedding bio-molecules or catalysts, or the like.

BEST MODE FOR CARRYING OUT THE INVENTION

Reference will now be made in detail to the preferred embodiments of the present invention. It is to be understood that the following examples are illustrative only and the present invention is not limited thereto.

EXAMPLES 1-6

Preparation of Radially Multi-branched Polymer and Manufacture of Insulating Film Comprising the Same

EXAMPLE 1

Preparation of Radially Hexa-branched Polyethylene Oxide Porogen Using Nucleophilic Substitution Reaction (Reaction Scheme 1)

228 mg of NaH from which mineral oil is removed was suspended in 50 ml of distilled 1,4-dioxane at room temperature under nitrogen atmosphere. Next, 3.3 g of polyethylene oxide monomethyl ether having an average molecular weight of 350 was added thereto and then the mixture was stirred for about 1 hour to form oxide anion. Further, 1.0 g of hexakis(bromomethyl)benzene was added thereto and the mixture was stirred for about 10 hours while heated to 80° C. Then, the mixture was cooled to room temperature, quenched with 10% HCl solution and shaken with dichloromethane and deionized water to separate an organic phase. Then, the organic phase was passed through a silica gel column to perform purification. The organic solvent was removed in a rotary evaporator to obtain 3.5 g of a final product as a pale yellow liquid.

According to GPC (Gel Permeation Chromatography) analysis, the product had a weight average molecular weight of 2670 and a number average molecular weight of 2450. According to TGA (Thermo Gravimetric Analysis), the product was shown to be removed well at 200-400° C.

400 MHz $^1$H-NMR, $CDCl_3$, δ (ppm): 3.28 (s, 3H, $OCH_3$), 3.44~3.72 ($OCH_2CH_2O$), 4.59 (s, 2H, $OCH_2Ph$)).

EXAMPLE 2

Preparation of Radially Hexa-branched Polypropylene Oxide Porogen Using Nucleophilic Substitution Reaction (i) (Reaction Scheme 1)

2-1. Radially Hexa-branched Polypropylene Oxide Porogen 228 mg of NaH from which mineral oil is removed was suspended in 50 ml of distilled 1,4-dioxane at room temperature under nitrogen atmosphere. Next, 3.2 g of polypropylene oxide monobutyl ether having an average molecular weight of 340 was added thereto and then the mixture was stirred for about 1 hour to form oxide anion. Further, 1.0 g of hexakis(bromomethyl)benzene was added thereto and the mixture was stirred for about 10 hours while heated to 80° C. Then, the mixture was cooled to room temperature, quenched with 10% HCl solution and shaken with ethyl acetate and deionized water to separate an organic phase. Then, the organic phase was passed through a silica gel column to perform purification. The organic solvent was removed in a rotary evaporator to obtain 3.3 g of a final product as a pale yellow liquid.

According to GPC analysis, the product had a weight average molecular weight of 3480 and a number average molecular weight of 3010. According to TGA, the product was shown to be removed well at 200-400° C.

400 MHz $^1$H-NMR, $CDCl_3$, δ (ppm): 0.91 (t, 3H), 1.11~1.23 ($OCHCH_3CH_2O$), 1.35 (m, 2H), 1.55 (m, 2H), 3.31~3.69 ($OCHCH_3CH_2O$), 4.55 (br, 1H, $OCH_2Ph$), 4.75 (br, 1H, $OCH_2Ph$).

2-2. Manufacture of Insulating Film

Methyl trimethoxysilane and tetramethoxysilane were mixed in an organic solvent with a mole ratio of 100:60. Next, 0.005 moles of nitric acid per mole of the silane compounds and 2 moles of water per mole of hydrolysable functional groups were added to perform hydrolytic condensation reaction, thereby forming an organopolysiloxane. As a porogen, the hexa-branched polypropylene oxide obtained from Example 2-1 was used. After spin coating, the coating layer was warmed to 420° C. at 10° C./min and left for 1 hour. The resultant insulating film showed a dielectric constant of 2.247 and strength of 4.85 GPa.

EXAMPLE 3

Preparation of Radially Hexa-branched Polypropylene Oxide Porogen Using Nucleophilic Substitution Reaction (ii) (Reaction Scheme 1)

228 mg of NaH from which mineral oil is removed was suspended in 50 ml of distilled 1,4-dioxane at room temperature under nitrogen atmosphere. Next, 9,4 g of polypropylene oxide monobutyl ether having an average molecular weight of 1000 was added thereto and then the mixture was stirred for about 1 hour to form oxide anion. Further, 1.0 g of hexakis(bromomethyl)benzene was added thereto and the mixture was stirred for about 24 hours while heated to 90° C. Then, the mixture was cooled to room temperature, quenched with 10% HCl solution and shaken with ethyl acetate and deionized water to separate an organic phase. Then, the organic phase was passed through a silica gel column to perform purification. The organic solvent was removed in a rotary evaporator to obtain 9.3 g of a final product as a pale yellow liquid with a high yield.

According to GPC analysis, the product had a weight average molecular weight of 10200 and a number average molecular weight of 8500. According to TGA, the product was shown to be removed well at 200-400° C.

400 MHz $^1$H-NMR, CDCl$_3$, δ (ppm): 0.91 (t, 3H), 1.11~1.20 (OCHCH$_3$CH$_2$O), 1.34 (m, 2H), 1.58 (m, 2H), 3.35~3.65 (OCHCH$_3$CH$_2$O), 4.58 (br, 1H, OCH$_2$Ph), 4.72 (br, 1H, OCH$_2$Ph).

EXAMPLE 4

Benzene Ring Formation Using Metal (Reaction Scheme 3)

10.0 g of 2-butyne-1,4-diether (a compound prepared from polypropylene oxide monobuthyl ether having Mn of 340) was dissolved in degassed toluene (30 ml) under nitrogen atmosphere. Next, 5 mol % of Co$_2$CO$_8$ was added thereto and the mixture was heated at 100° C. for 48 hours. The mixture was cooled to room temperature and toluene was distilled out under pressure. Then, the crude product was dissolved in CH$_2$Cl$_2$ and passed through a silica gel pad to perform purification. After purification, 9.8 g of a final product was obtained. The product showed the same NMR data as described in Example 2.

EXAMPLE 5

Preparation of Radially Penta-branched Polypropylene Oxide Porogen Using Nucleophilic Substitution Reaction and Determination of Physical Properties 5-1. Radially Penta-branched Polypropylene Oxide Porogen 230 mg of NaH from which mineral oil is removed was suspended in 50 ml of distilled 1,4-dioxane at room temperature under nitrogen atmosphere. Next, 3.14 g of polypropylene oxide monobutyl ether having an average molecular weight of 340 was added thereto and then the mixture was stirred for about 1 hour to form oxide anion. Further, 1.0 g of pentakis(bromomethyl)benzene (C$_{11}$H$_{11}$Br$_5$), which was prepared by the method disclosed in Japanese Laid-Open Patent No. 1995-242722, was added thereto and the mixture was stirred for about 10 hours while heated to 80° C. Then, the mixture was cooled to room temperature, quenched with 10% HCl solution and shaken with ethyl acetate and deionized water to separate an organic phase. Then, the organic phase was passed through a silica gel column to perform purification. The organic solvent was removed in a rotary evaporator to obtain 3.2 g of a final product as a pale yellow liquid.

According to GPC analysis, the product had a weight average molecular weight of 3120 and a number average molecular weight of 2910. According to TGA, the product was shown to be removed well at 200-400° C.

400 MHz $^1$H-NMR, CDCl$_3$, δ (ppm): 0.93 (t, 3H), 1.13~1.25 (OCHCH$_3$CH$_2$O) 1.35 (m, 2H), 1.57 (m, 2H), 3.31~3.70 (OCHCH$_3$CH$_2$O), 4.55 (br, 1H, OCH$_2$Ph), 4.75 (br, 1H, OCH$_2$Ph)), 7.43 (s, 1H).

5-2. Manufacture of Insulating Film

Example 2-2 was repeated to manufacture an insulating film, except that the penta-branched polypropylene oxide obtained from Example 5-1 was used as a porogen instead of the hexa-branched polypropylene oxide obtained from Example 2-1. The resultant insulating film showed a dielectric constant of 2.25 and strength of 4.70 GPa.

EXAMPLE 6

Preparation of Radially Tetra-branched Polypropylene Oxide Porogen Using Nucleophilic Substitution Reaction and Determination of Physical Properties 6-1. Radially Tetra-branched Polypropylene Oxide Porogen 220 mg of NaH from which mineral oil is removed was suspended in 50 ml of distilled 1,4-dioxane at room temperature under nitrogen atmosphere. Next, 3.04 g of polypropylene oxide monobutyl ether having an average molecular weight of 340 was added thereto and then the mixture was stirred for about 1 hour to form oxide anion. Further, 1.0 g of 1,2,4,5-tetrakis(bromomethyl) benzene (C$_{10}$H$_{10}$Br$_4$) was added thereto and the mixture was stirred for about 10 hours while heated to 80° C. Then, the mixture was cooled to room temperature, quenched with 10% HCl solution and shaken with ethyl acetate and deionized water to separate an organic phase. Then, the organic phase was passed through a silica gel column to perform purification. The organic solvent was removed in a rotary evaporator to obtain 3.0 g of a final product as a pale yellow liquid.

According to GPC analysis, the product had a weight average molecular weight of 2450 and a number average molecular weight of 2290. According to TGA, the product was shown to be removed well at 200-400° C.

400 MHz $^1$H-NMR, CDCl$_3$, δ (ppm): 0.90 (t, 3H), 1.10~1.25 (OCHCH$_3$CH$_2$O), 1.33 (m, 2H), 1.57 (m, 2H), 3.30~3.70 (OCHCH$_3$CH$_2$O), 4.57 (br, 1H, OCH$_2$Ph), 4.77 (br, 1H, OCH$_2$Ph)), 7.39 (s, 2H).

6-2. Manufacture of Insulating Film

Example 2-2 was repeated to manufacture an insulating film, except that the tetra-branched polypropylene oxide obtained from Example 6-1 was used as a porogen instead of the hexa-branched polypropylene oxide obtained from Example 2-1. The resultant insulating film showed a dielectric constant of 2.27 and strength of 4.55 GPa.

EXAMPLE 7

Preparation of Radially Tri-branched Polypropylene Oxide Porogen Using Nucleophilic Substitution Reaction and Determination of Physical Properties 7-1. Tri-branched Polypropylene Oxide Porogen 210 mg of NaH from which mineral oil is removed was suspended in 50 ml of distilled 1,4-dioxane at room temperature under nitrogen atmosphere. Next, 2.86 g of polypropylene oxide monobutyl ether having an average molecular weight of 340 was added thereto and then the mixture was stirred for about 1 hour to form oxide anion. Further, 1.0 g of 1,3,5-tris(bromomethyl)benzene (C$_9$H$_9$Br$_3$) was added thereto and the mixture was stirred for about 10 hours while heated to 80° C. Then, the mixture was cooled to room temperature, quenched with 10% HCl solution and shaken with ethyl acetate and deionized water to separate an organic phase. Then, the organic phase was passed through a silica gel column to perform purification. The organic solvent was removed in a rotary evaporator to obtain 2.8 g of a final product as a pale yellow liquid.

According to GPC analysis, the product had a weight average molecular weight of 1800 and a number average molecular weight of 1670. According to TGA, the product was shown to be removed well at 200-400° C.

400 MHz $^1$HNMR, CDCl$_3$, δ (ppm): 0.91 (t, 3H), 1.11~1.23 (OCHCH$_3$CH$_2$O) 1.35 (m, 2H), 1.55 (m, 2H), 3.31~3.69 (OCHCH$_3$CH$_2$O), 4.55 (br, 1H, OCH$_2$Ph), 4.75 (br, 1H, OCH$_2$Ph)), 7.40 (s, 3H).

7-2. Manufacture of Insulating Film

Example 2-2 was repeated to manufacture an insulating film, except that the tri-branched polypropylene oxide obtained from Example 7-1 was used as a porogen instead of the hexa-branched polypropylene oxide obtained from Example 2-1. The resultant insulating film showed a dielectric constant of 2.28 and strength of 4.40 GPa.

EXAMPLE 8

Preparation of Radially Hexa-branched Polyacrylate-based Porogen Using ATRP (Reaction Scheme 4) and Determination of Physical Properties 8-1. Hexa-branched Polyacrylate-based Porogen 2 g of hexakis(bromomethyl)benzene was dissolved in 30 ml of DMSO (dimethyl sulfoxide) as a solvent and 3.2 g of bromoisobutyric acid and 3.0 g of K$_2$CO$_3$ were added thereto. Next, the mixture was heated for about 40 hours at 100° C. and an organic phase was separated from the mixture with 10% aqueous HCl solution and ether. The organic phase was subjected to column chromatography to separate 3.4 g of a final product as a white solid. (400 MHz $^1$H-NMR, CDCl$_3$, δ (ppm): 1.91 (s, 6H), 5.23 (s, 2H).

Then, 1 g of the white solid and 9 g of methyl methacrylate were dissolved in 30 ml of toluene. 130 mg of CuBr and 1 g of 2-pyridinecarboxyaldehyde n-butylimine were added thereto and the mixture was heated for 20 hours at 90° C. Next, the mixture was cooled to room temperature and the Cu-containing compound was removed with a celite filter. The filtrate was treated with 10% aqueous HCl solution and ethyl acetate to separate an organic phase. The organic phase was distilled under pressure to obtain a product as a light green solid. The product was dissolved in CH$_2$Cl$_2$ and purified by column chromatography to obtain about 9 g of a pale yellow solid. 9 g of the pale yellow solid was dissolved in oxygen-free benzene and 3 g of tris(trimethylsilyl) silane and 200 mg of AIBN (azo-bis-isobutyronitrile) were added thereto. The mixture was reacted for 20 hours at 70° C. and then benzene was distilled out under pressure. Further, recrystallization was performed with ether to obtain about 8.4 g of a final product as a white solid. According to GPC analysis, the polymer product had Mw (weight average molecular weight) of 22000 and PDI (polydispersity index) of 1.41. According to TGA, the product was removed well at a temperature of between 350° C. and 400° C.

400 MHz $^1$H-NMR, CDCl$_3$, δ (ppm): 0.85 (s, 3H), 1.02 (s, 3H), 1.64~2.10 (m, 2H), 3.58 (s, 3H), 5.20 (s, 2H).

8-2. Manufacture of Insulating Film

Example 2-2 was repeated to manufacture an insulating film, except that the hexa-branched polyacrylate porogen obtained from Example 8-1 was used instead of the hexa-branched polypropylene oxide obtained from Example 2-1. The resultant insulating film showed a dielectric constant of 2.26 and strength of 4.74 GPa.

COMPARATIVE EXAMPLES 1-3

Manufacture of Insulating Film

COMPARATIVE EXAMPLE 1

Example 2-2 was repeated to manufacture an insulating film, except that a linear polypropylene glycol dibutyl ether having a molecular weight of 3500 was used as a porogen (pore generator: pore-generating organic polymer) instead of the hexa-branched polypropylene oxide obtained from Example 2-1.

COMPARATIVE EXAMPLES 2 AND 3

Example 2-2 was repeated to manufacture insulating films of Comparative Examples 2 and 3, except that tetra-branched 2,3,5,6-polyethylene oxide ethylene (prepared from Example 57 disclosed in Korean Patent Application No. 2002-80196) and tetra-branched 2,3,5,6-polyethylene oxide ethylene (prepared from Example 58, ibid.) were used as a porogen (pore generator: pore-forming organic polymer), respectively, instead of the hexa-branched polypropylene oxide obtained from Example 2-1 (See Table 1).

TABLE 1

| Korean Patent Application No. 2002-80196 | Porogen | R |
|---|---|---|
| Comp. Ex. 2 (Example 57) | ROOC-[benzene ring]-COOR ROOC-[benzene ring]-COOR | —O—(CH$_2$CH$_2$O)n—CH, n = 16.3, Mn = 350 |
| Comp. Ex. 3 (Example 58) | | —OCH$_2$—[branched: (OCH$_2$CH$_2$)n—OCH$_3$ and (OCH$_2$CH$_2$)n—OCH], n = 7.2, Mn = 350 |

EXPERIMENTAL EXAMPLE 1

Evaluation of Insulating Films

In order to determine physical properties of insulating films using radially multi-branched polymer porogens according to the present invention, mechanical strength and dielectric constant of each insulating film were measured as follows:

The insulating film manufactured by using hexa-branched polypropylene oxide according to Example 2 was used and the condition of the cured insulating film was observed with an optical microscope and an electron microscope. Additionally, dielectric characteristics of the film were determined by measuring the dielectric constant in the manner of MIS (metal/insulator/semiconductor).

Figure 1:
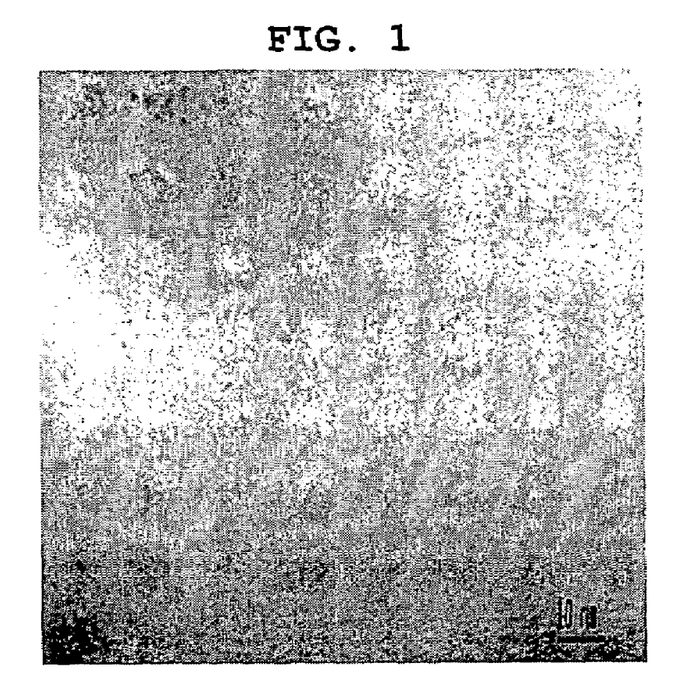
FIG. 1 is a TEM (Transmission Electron Microscope) photograph showing a porous film obtained by using the radially hexa-branched porogen according to Example 2 in the amount of 30 wt %.

After observing the inside of the film with an electron microscope, pores greater than 5 nm were not found. This indicates that pores with a very small size were generated (See FIG. 1). The following Table 2 shows the tendency of mechanical strength and dielectric constant of the film depending on siloxane composition and porogen content. As can be seen from Table 2, dielectric constant significantly decreases in proportion to the content of a radially multi-branched polymer.

TABLE 2

| Silane Monomers | Amount (mole ratio) | Porogen Content (wt %) | Refractive Index | Strength (GPa) | Dielectric Constant |
|---|---|---|---|---|---|
| MTMS:TMOS | 100:60 | 0 | 1.402 | 13.48 | 3.280 |
|  |  | 10 | 1.364 | 10.19 | 2.975 |
|  |  | 20 | 1.326 | 7.07 | 2.571 |
|  |  | 30 | 1.289 | 4.85 | 2.247 |
|  |  | 40 | 1.249 | 1.86 | 1.849 |

EXPERIMENTAL EXAMPLE 2

Evaluation of Insulating Films Comprising Linear Porogen and Radially Multi-branched Porogens In order to compare physical properties of an insulating films manufactured by using a linear porogen with those of an insulating film manufactured by using a radially multi-branched polymer porogen, the following experiment was performed.

Insulating films manufactured by using the radially multi-branched polymer porogens according to Examples 2, 5, 6, 7 and 8 were used. Additionally, insulating films of Comparative Examples 1 to 3 manufactured by using a linear porogen and a tetra-branched porogen prepared according to Korean Patent Application No. 2002-80196, as control. The condition of each cured insulating film was observed with an optical microscope and an electron microscope. Further, dielectric characteristics of each film were determined by measuring the dielectric constant in the manner of MIS (metal/insulator/semiconductor).

Figure 2:
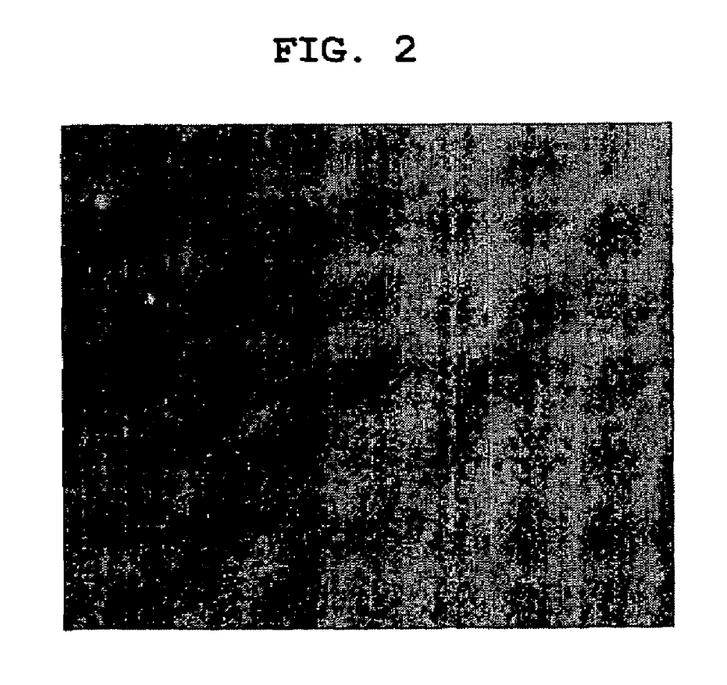
FIG. 2 is a photograph taken by an optical microscope showing a porous film obtained by using the tetra-branched porogen according to Comparative Example 3.

The cured film of Comparative Example 1 using a linear polypropyleneglycol dibutyl ether having a molecular weight of 3500 as a porogen showed a slight striation pattern and partial phase separation, and thus a completely transparent film cannot be obtained. Similarly, the cured film using a tetra-branched porogen of Comparative Example 2 showed a slight striation pattern and partial phase separation, and thus a completely transparent film cannot be obtained. Additionally, the cured film using a tetra-branched porogen of Comparative Example 3 showed a clear striation pattern and complete phase separation (See, FIG. 2). On the other hand, each of the cured films manufactured by using porogens according to the preferred embodiments of the present invention was a transparent film having excellent coatability with no phase separation (See, FIG. 1).

Further, as can be seen from the following Table 3, the cured film of Example 2 using a sphere-shaped radially hexa-branched polypropyleneglycol ether as a porogen has excellent film coatability and non-phase separation behavior compared to Comparative Example 1 using a linear polypropyleneglycol ether, even though both porogens have a similar molecular weight. Moreover, when insulating films according to Example 2 and Comparative Example 1 are manufactured to have a similar dielectric constant, insulating film of Example 2 shows higher strength. Similarly, when insulating films according to Example 6 and Comparative Example 2 (each using a tetra-branched porogen) are manufactured to have a similar dielectric constant, insulating film of Example 6 shows higher strength. Meanwhile, the cured film of Comparative Example 3 obtained by using a tetra-branched porogen showed complete phase separation and thus it was not possible to measure the dielectric constant and strength.

TABLE 3

|  | Porogen | Dielectric Constant | Strength (GPa) |
|---|---|---|---|
| Ex. 2 | Radial (hexa-branched) | 2.247 | 4.85 |
| Ex. 5 | Radial (penta-branched) | 2.25 | 4.70 |
| Ex. 6 | Radial (tetra-branched) | 2.27 | 4.55 |
| Ex. 7 | Radial (tri-brahched) | 2.28 | 4.40 |
| Ex. 8 | Radial (hexa-branched) | 2.26 | 4.74 |
| Comp. Ex. 1 | Linear | 2.249 | 4.18 |
| Comp. Ex. 2 | Radial (tetra-branched) | 2.27 | 4.21 |
| Comp. Ex. 3 | Radial (tetra-branched) | — | — |

INDUSTRIAL APPLICABILITY

As can be seen from the foregoing, radially multi-branched polymers according to the present invention are prepared with ease and have easily controllable molecular weight and uniform molecular weight distribution. When they are used in manufacturing porous insulating films as porogens, it is possible to obtain low dielectric insulating films having easily controllable micropores.

While this invention has been described in connection with what is presently considered to be the most practical and preferred embodiment, it is to be understood that the invention is not limited to the disclosed embodiment and the drawings. On the contrary, it is intended to cover various modifications and variations within the spirit and scope of the appended claims.

What is claimed is:

1. A radially multi-branched polymer represented by formula (I), which includes a central molecule (A) to which side-branches (B) are bonded in at least three positions ($i \geq 3$):

$$AB_i \quad (I)$$

wherein the central molecule (A) is selected from the group consisting of:

(II)

(III)

wherein X is H or CH₃;
the side-branch (B) is —R or wherein R is selected from the group consisting of the following $R_1$ to $R_4$, with the proviso that if i is 3, R is selected from the group consisting of $R_1$, $R_3$ and $R_4$;

$R_1$ is selected from the group consisting of: $(OCH_2CH_2)_nOZ$, $(OCH_2CHCH_3)_nOZ$, $(OCHCH_3CH_2)_nOZ$, $(OCH_2CH_2)_n(OCH_2CHCH_3)_m(OCH_2CH_2)_kOZ$, $(OCH_2CH_2)_n(OCHCH_3CH_2)_m(OCH_2CH_2)_kOZ$, $(OCH_2CHCH_3)_n(OCH_2CH_2)_m(OCH_2CHCH_3)_kOZ$, $(OCHCH_3CH_2)_n(OCH_2CH_2)_m(OCHCH_3CH_2)_kOZ$, $(OCH_2CHCH_3)_n(OCH_2CH_2)_m(OCHCH_3CH_2)_kOZ$ and $(OCHCH_3CH_2)_n(OCH_2CH_2)_m(OCH_2CHCH_3)_kOZ$;

$R_2$ is $OCOC(CH_3)_2(CH_2CQ(CO_2Z))_nW$;
$R_3$ is $(O(CH_2)_nCO)_mOZ$;
$R_4$ is $(NH(CH_2)_nCO)_mNZ_2$;

wherein each of n, m and k represents an integer between 0 and 200;

Q is selected from the group consisting of H, $CH_3$, $CH_2CH_3$, $CH_2CH_2OH$ and $CH_2CH_2NH_2$;

W is selected from Br, I and H;

Z is selected from the group consisting of H, methyl, ethyl, propyl, isopropyl, butyl, isobutyl, tert-butyl, pentyl, isopentyl, neopentyl, cyclopentyl, hexyl, cyclohexyl, vinyl (—CH=CH₂), —CCH, propargyl, allyl, benzyl, acetyl (COCH₃), propionyl, isobutyryl, neopetyryl, $CH_2CH_2CH_2Si(OMe)_3$, $CH_2CH_2CH_2Si(OEt)_3$, $CH_2CH_2CH_2SiMe(OMe)_2$, $CH_2CH_2CH_2SiMe(OEt)_2$, $CH_2CH_2CH_2Si(OMe)Me_2$, $CH_2CH_2CH_2Si(OEt)Me_2$, $CH_2CH_2OH$ and $CH_2CH_2NH_2$;

Y is a linking group between a central molecule and a side-branch, wherein Y is selected from the group consisting of O and $OCH_2$; and i is a natural number from 3 to 6.

2. The radially multi-branched polymer according to claim 1, wherein the polymer has an average molecular weight of 500 to 100,000.

3. The radially multi-branched polymer according to claim 2, wherein the polymer has an average molecular weight of 500 to 10,000.

4. The radially multi-branched polymer according to claim 1, wherein i is 6.

5. A porous insulating film formed by coating and heat-treating a solution containing a pore generator (porogen) and a highly heat resistant resin, wherein the pore generator is the multi-branched polymer according to claim 1.

6. The porous insulating film according to claim 5, wherein the pore generator is the multi-branched polymer according to claim 2.

7. The porous insulating film according to claim 5, wherein the pore generator is the multi-branched polymer according to claim 3.

8. The porous insulating film according to claim 5, wherein the pore generator is the multi-branched polymer according to claim 4.

9. The porous insulating film according to claim 5, wherein the solution contains the porogen in a weight ratio of between 100:2 and 50:50.

10. The porous insulating film according to claim 5, wherein the film is selected from the group consisting of an interlayer insulating film for electronic devices, a surface protective film for electronic devices, an interlayer insulating film for multilayer printed circuit boards, a protective film or insulating protective film for liquid crystal display devices, a low refractive film, a gas barrier film and a porous film for embedding bio-molecules or catalysts.

11. The radially multi-branched polymer according to claim 1, wherein i is a natural number of 4 to 6.

* * * * *